United States Patent
Nezu et al.

(10) Patent No.: US 7,678,225 B2
(45) Date of Patent: Mar. 16, 2010

(54) FOCUS RING FOR SEMICONDUCTOR TREATMENT AND PLASMA TREATMENT DEVICE

(75) Inventors: Takaaki Nezu, Nirasaki (JP); Katsumi Horiguchi, Nirasaki (JP); Daisuke Hayashi, Nirasaki (JP); Toshiya Tsukahara, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 306 days.

(21) Appl. No.: 10/468,108

(22) PCT Filed: Feb. 8, 2002

(86) PCT No.: PCT/JP02/01101

§ 371 (c)(1),
(2), (4) Date: Aug. 15, 2003

(87) PCT Pub. No.: WO02/065531

PCT Pub. Date: Aug. 22, 2002

(65) Prior Publication Data

US 2004/0074605 A1    Apr. 22, 2004

(30) Foreign Application Priority Data

Feb. 15, 2001   (JP) .............................. 2001-038396

(51) Int. Cl.
*H01L 21/306* (2006.01)
*C23C 16/00* (2006.01)

(52) U.S. Cl. .......................... 156/345.47; 118/723 VE (58) Field of Classification Search ........... 118/723 VE, 118/723 E, 723 R, 728; 156/345.4, 345.48, 156/345.43, 345.44, 345.47, 345.51, 345.45
See application file for complete search history.

(56) References Cited

U.S. PATENT DOCUMENTS

| | | | | |
|---|---|---|---|---|
| 5,292,554 A * | 3/1994 | Sinha et al. | .................. | 427/251 |
| 5,405,491 A * | 4/1995 | Shahvandi et al. | .......... | 438/710 |
| 5,665,166 A * | 9/1997 | Deguchi et al. | .......... | 118/723 E |
| 5,740,009 A * | 4/1998 | Pu et al. | ..................... | 361/234 |
| 5,868,848 A * | 2/1999 | Tsukamoto | ............. | 118/723 E |
| 5,919,332 A * | 7/1999 | Koshiishi et al. | ........ | 156/345.47 |
| 6,008,130 A * | 12/1999 | Henderson et al. | .......... | 438/710 |
| 6,042,687 A * | 3/2000 | Singh et al. | ............ | 156/345.33 |
| 6,096,161 A * | 8/2000 | Kim et al. | .............. | 156/345.47 |
| 6,159,299 A * | 12/2000 | Koai et al. | ................... | 118/715 |
| 6,475,336 B1 * | 11/2002 | Hubacek | ................. | 156/345.51 |
| 6,506,685 B2 * | 1/2003 | Li et al. | ...................... | 438/710 |

(Continued)

FOREIGN PATENT DOCUMENTS

JP         7-78802         3/1995

(Continued)

*Primary Examiner*—Sylvia R. MacArthur
(74) *Attorney, Agent, or Firm*—Oblon, Spivak, McClelland, Maier & Neustadt, L.L.P.

(57) ABSTRACT

A focus ring for a plasma processing apparatus has an inner region, middle region, and outer region, disposed in this order from the inner side to surround a target substrate. On the side to be exposed to plasma, the surfaces of the inner region and outer region consist essentially of a dielectric, while the surface of the middle region consists essentially of a conductor. The middle region is arranged to shift the peak of plasma density to the outside of the peripheral edge of the target substrate. If there is no middle region, the peak of plasma density appears substantially directly above the peripheral edge of the target substrate.

10 Claims, 6 Drawing Sheets

U.S. PATENT DOCUMENTS

| | | | |
|---|---|---|---|
| 6,551,448 B2 * | 4/2003 | Kuga et al. | 156/345.51 |
| 6,676,804 B1 * | 1/2004 | Koshimizu et al. | 156/345.53 |
| 6,779,481 B2 * | 8/2004 | Kent et al. | 118/723 R |
| 2004/0241995 A1 * | 12/2004 | Yamanaka | 438/689 |
| 2005/0172904 A1 * | 8/2005 | Koshimizu et al. | 118/728 |

FOREIGN PATENT DOCUMENTS

| | | |
|---|---|---|
| JP | 10-256977 | 10/1998 |
| JP | 10265977 | * 10/1998 |
| JP | 2002-190466 | 7/2002 |
| JP | 2002-222798 | 8/2002 |

* cited by examiner

FOCUS RING FOR SEMICONDUCTOR TREATMENT AND PLASMA TREATMENT DEVICE

TECHNICAL FIELD

The present invention relates to a focus ring and plasma processing apparatus for a semiconductor process, and more particularly to a focus ring and plasma processing apparatus that prevent abnormal electric discharge from occurring on the peripheral portion of a target substrate, such as a wafer, during a plasma process. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

BACKGROUND ART

Figure 8:
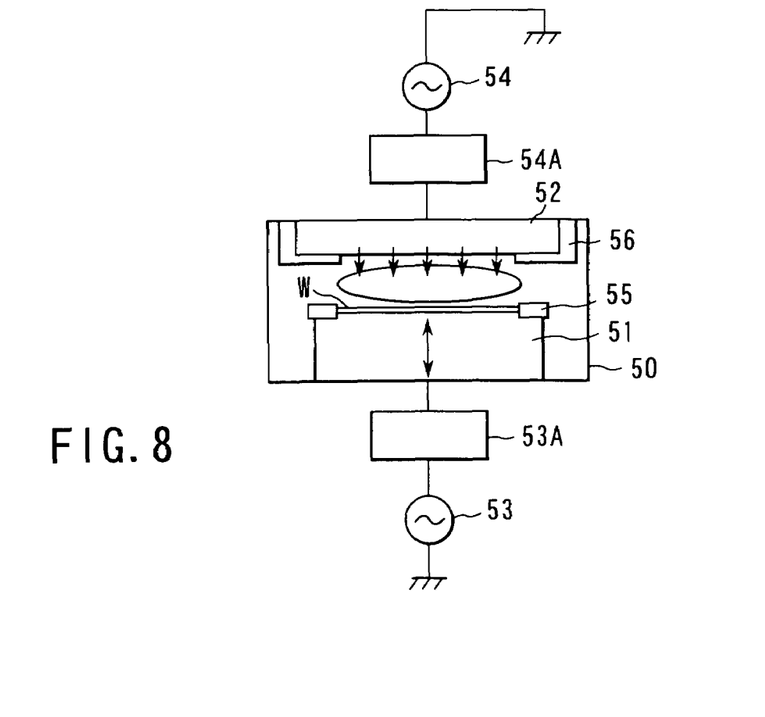
FIG. 8 is a schematic view showing the general structure of a plasma etching apparatus.

FIG. 8 is a schematic view showing the general structure of a plasma etching apparatus. The plasma etching apparatus has an airtight and cylindrical process chamber 50. A worktable (used also as a lower electrode) 51 for supporting a wafer W handled as a target substrate is disposed (e.g. movable up and down) on the lower side in the process chamber 50. A showerhead (used also as an upper electrode) 52 for supplying a process gas is disposed on the upper side in the process chamber 50 and faces the lower electrode 51 in parallel therewith. The two electrodes 51 and 52 are respectively supplied with RF (radio frequency) powers different in frequency from first and second RF power supplies 53 and 54 through matching circuits 53A and 54A. With the RF powers applied to the electrodes 51 and 52, an RF electric field is formed in the process chamber 50. The RF electric field helps the process gas turn into plasma, which then etches a film, such as an insulating film, on the surface of the wafer W.

A focus ring 55 is disposed on the peripheral portion of the lower electrode 51 and surrounds the wafer W on the lower electrode 51. On the other hand, a shield ring 56 is disposed on the peripheral portion of the upper electrode 52. The focus ring 55 and shield ring 56 work on plasma generated between the upper and lower electrodes 51 and 52 to focus toward the wafer W.

In the conventional plasma etching apparatus, problems have been found in that abnormal electric discharge tends to occur on the peripheral portion of a wafer W, and lowers the etching planar uniformity and/or selectivity.

DISCLOSURE OF INVENTION

An object of the present invention is to provide a focus ring and plasma processing apparatus, which prevent abnormal electric discharge from occurring during plasma processing on the peripheral portion of a target substrate, such as a wafer.

According to a first aspect of the present invention, there is provided a focus ring to be used in a plasma processing apparatus, which excites a process gas to turn into plasma in an airtight process chamber and utilizes the plasma to perform a semiconductor process on a target substrate placed on a worktable, wherein the focus ring is placed to surround the target substrate in order to cause the plasma to focus toward the target substrate, the focus ring comprising:

an inner region configured to surround the target substrate, and having a surface consisting essentially of a dielectric on a side to be exposed to the plasma;

a middle region surrounding the inner region, and having a surface consisting essentially of a conductor on a side to be exposed to the plasma; and an outer region surrounding the middle region, and having a surface consisting essentially of a dielectric on a side to be exposed to the plasma.

According to a second aspect of the present invention, there is provided a plasma processing apparatus for a semiconductor process, comprising:

an airtight process chamber;

a supply system configured to supply a process gas into the process chamber;

an exhaust system configured to vacuum-exhaust the process chamber;

an exciting mechanism configured to excite the process gas to turn into plasma;

a worktable disposed in the process chamber and having a main mount surface to support a target substrate; and a focus ring according to a first aspect and disposed to surround the target substrate in order to cause the plasma to focus toward the target substrate.

According to a third aspect of the present invention, there is provided a focus ring to be used in a plasma processing apparatus, which excites a process gas to turn into plasma in an airtight process chamber and utilizes the plasma to perform a semiconductor process on a target substrate placed on a worktable, wherein the focus ring is placed to surround the target substrate in order to cause the plasma to focus toward the target substrate, the focus ring comprising:

a first region configured to surround the target substrate, and having a surface consisting essentially of a dielectric on a side to be exposed to the plasma; and a second region surrounding the first region, and having a surface consisting essentially of a dielectric on a side to be exposed to the plasma, wherein the first region has a resistance lower than the second region in a thickness direction.

According to a fourth aspect of the present invention, there is provided a plasma processing apparatus for a semiconductor process, comprising:

an airtight process chamber;

a supply system configured to supply a process gas into the process chamber;

an exhaust system configured to vacuum-exhaust the process chamber;

an exciting mechanism configured to excite the process gas to turn into plasma;

a worktable disposed in the process chamber and having a main mount surface to support a target substrate; and a focus ring according to a third aspect and disposed to surround the target substrate in order to cause the plasma to focus toward the target substrate.

BEST MODE FOR CARRYING OUT THE INVENTION

In the process of developing the present invention, the inventors studied the causes as to why abnormal electric discharge tends to occur during plasma processing on the peripheral portion of a target substrate, such as a wafer. As a result, the inventors have arrived at the findings given below.

Figure 9A:
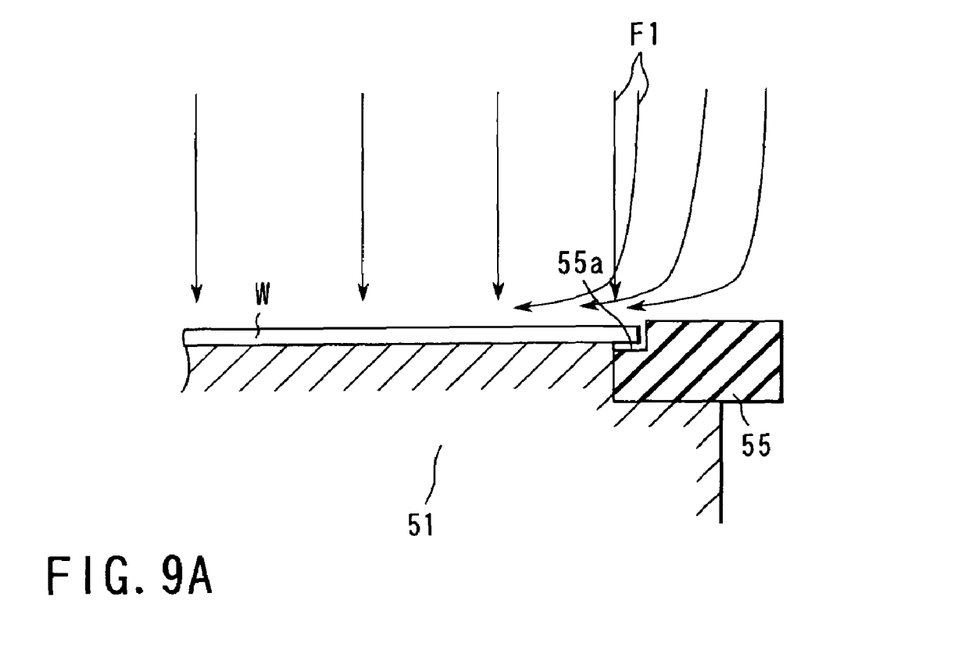
FIGS. 9A and 9B are enlarged sectional views each showing the relationship between a conventional focus ring, and a worktable and wafer, in a plasma etching apparatus.
Figure 9B:
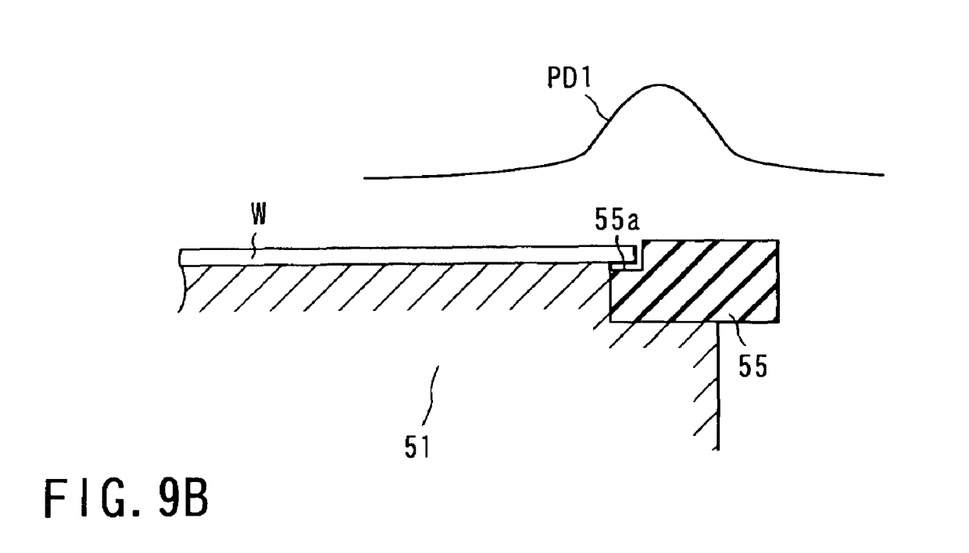

FIGS. 9A and 9B are enlarged sectional views each showing the relationship between a conventional focus ring, and a worktable and wafer, in a plasma etching apparatus. As shown in FIG. 9A, the focus ring 55 has a top face almost level with the top surface of the wafer W, on a side to be exposed to plasma. An inner extending step 55a is formed on the inner peripheral end of the focus ring 55 and extends under the wafer W. The focus ring 55 is formed of a dielectric body (insulating body), such as quartz. Accordingly, the plasma is attracted by the wafer W rather than the focus ring 55, so that the plasma is focused toward the surface of the wafer W, as shown by arrows F1 in FIG. 9A.

Since the plasma is focused by the focus ring 55, the plasma concentrates near the peripheral edge of the wafer W, as shown by the arrows F1. In other words, as shown by a curved line PD1 in FIG. 9B, the plasma density becomes higher at the periphery of the wafer W than at the center thereof. Due to such bad uniformity in the plasma density, abnormal electric discharge is likely to occur on the periphery of the wafer W, where the plasma density is higher. This causes problems in that the etching planar uniformity and/or selectivity become lower.

Embodiments of the present invention achieved on the basis of the findings given above will now be described with reference to the accompanying drawings. In the following description, the constituent elements having substantially the same function and arrangement are denoted by the same reference numerals, and a repetitive description will be given only when necessary.

Figure 1:
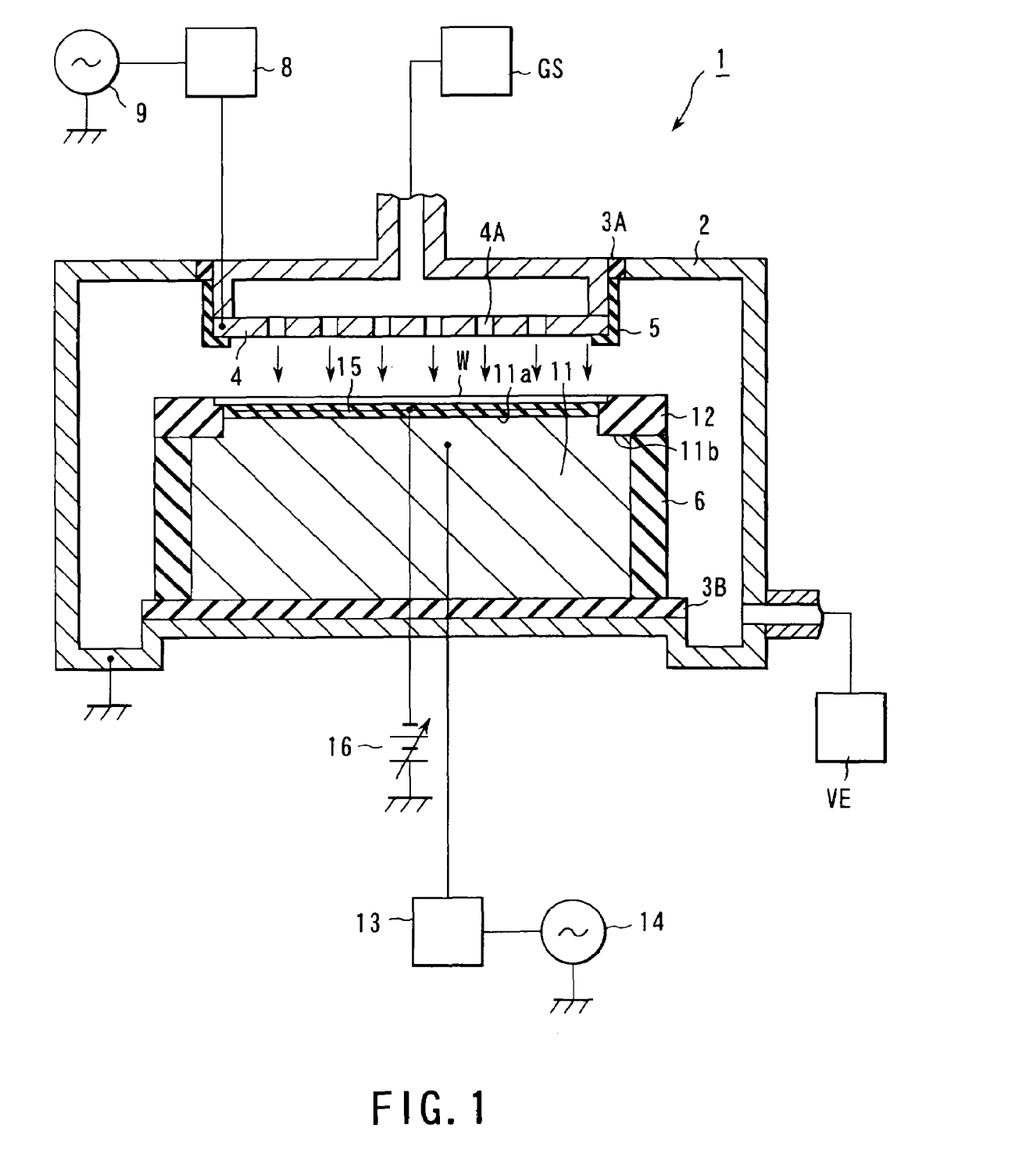
FIG. 1 is a structural view showing a plasma etching apparatus, which is a plasma processing apparatus according to an embodiment of the present invention.

FIG. 1 is a structural view showing a plasma etching apparatus, which is a plasma processing apparatus according to an embodiment of the present invention. The plasma etching apparatus 1 has an airtight cylindrical process chamber 2 for accommodating a target substrate, such as a semiconductor wafer W. The process chamber 2 is formed of a conductive body, such as aluminum with an anodized inner surface, and is grounded through a ground line. A vacuum exhaust section VE including a turbo molecular pump and so forth is connected to a lower portion of the sidewall of the process chamber 2 through an exhaust line. The vacuum exhaust section VE exhausts the process chamber 2, and sets it at a predetermined vacuum level.

On the other hand, a disc like showerhead 4 is disposed on the ceiling of the process chamber 2, and is connected to a process gas supply section GS of an etching gas and other gases through a gas supply line. The showerhead 4 is provided with a number of holes 4A formed on the bottom face, for spouting process gases. The showerhead 4 has a bottom plate formed of an electrode plate, and is also used as an upper electrode. The showerhead 4 is electrically insulated from the casing of the process chamber 2 by an insulating body 3A. A shield ring 5 is disposed on the peripheral edge of the electrode plate of the showerhead 4.

A worktable 11 formed of a cylindrical column is disposed on the bottom of the process chamber 2 and has a main mount surface 11a for placing a wafer W thereon. The peripheral portion of the worktable 11 has a sub-mount surface 11b positioned lower than the main mount surface 11a, such that a focus ring 12 is placed on the sub-mount surface 11b to surround the wafer W. The worktable 11 is formed of a conductive body, such as aluminum with an anodized surface, and is also used as a lower electrode. The worktable 11 is disposed in an insulating frame 6. The worktable 11 is also electrically insulated from the casing of the process chamber 2 by an insulating plate 3B made of, e.g., ceramic.

An electrostatic chuck 15 having a diameter almost the same as the wafer W is disposed on the worktable 11. The electrostatic chuck 15 is arranged such that a conductive layer is sandwiched between two polymer films of polyimide. The conductive layer is supplied with a DC voltage of, e.g., 1.5 kV from a DC high power supply 16 disposed outside the process chamber 2. As a consequence, a wafer W placed on the electrostatic chuck 15 is attracted and held on the top on the worktable 11 by means of Coulomb's force.

The upper electrode of the showerhead 4 is connected to an RF (radio frequency) power supply 9 through a matching circuit 8. The upper electrode 4 is supplied with an RF power of 13.56 MHz, 27.12 MHz, or 60 MHz from the RF power supply 9. On the other hand, the lower electrode or worktable 11 is connected to an RF power supply 14 through a matching circuit 13. The lower electrode 11 is supplied with an RF power of 800 kHz or 2 MHz from the RF power supply 14. The RF power applied to the upper electrode 4 forms an RF electric field in the process chamber 2, for exciting a process gas to turn into plasma. The RF power applied to the lower electrode 11 generates a self-bias in the worktable 11, for attracting ions towards the wafer W.

Figure 2:
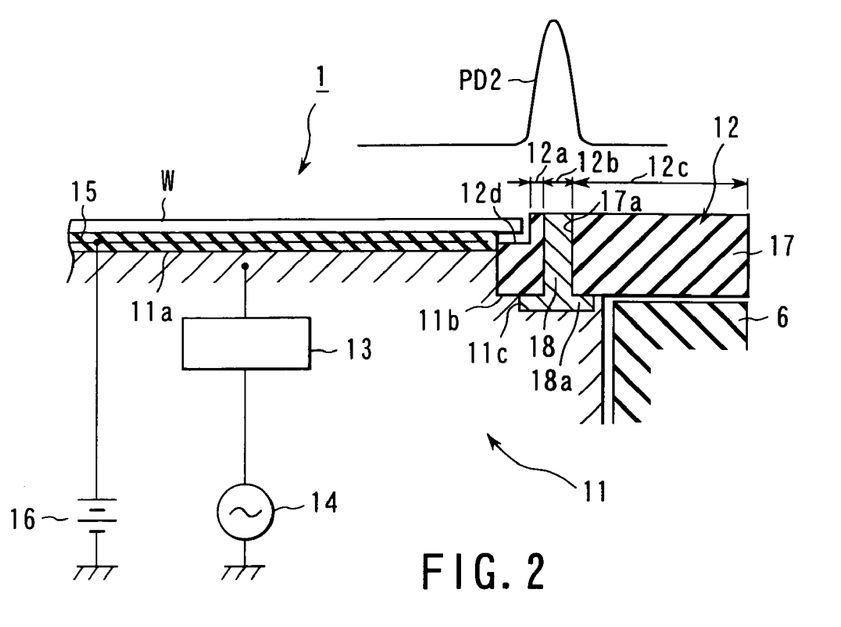
FIG. 2 is an enlarged sectional view showing the relationship between a focus ring, worktable, and wafer, in the plasma etching apparatus shown in FIG. 1.
Figure 3A:
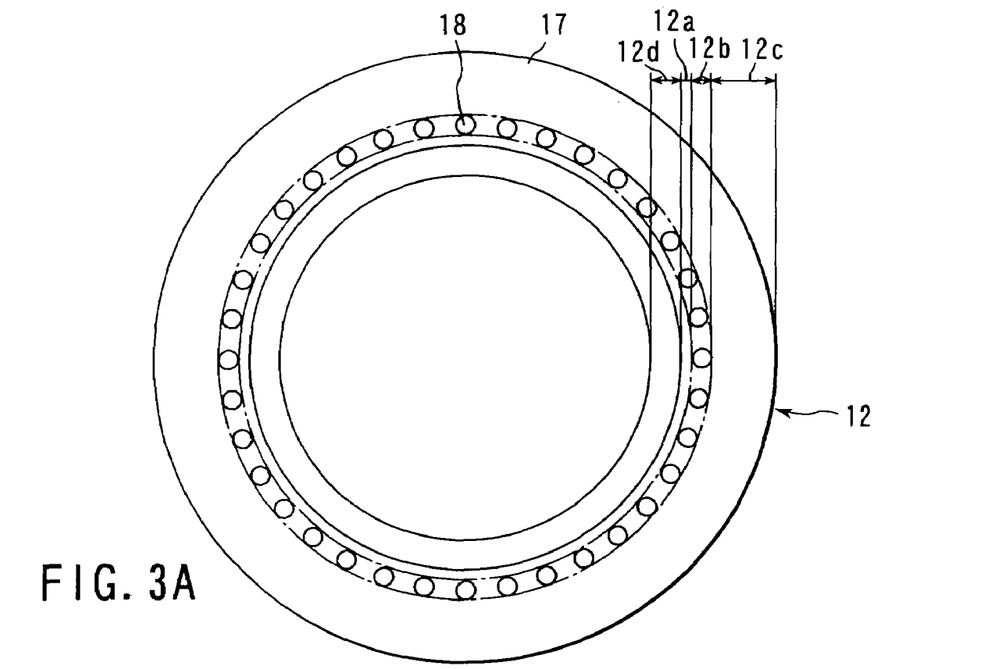
FIGS. 3A and 3B are plan views respectively showing the focus ring in FIG. 2 and its modification.

FIG. 2 is an enlarged sectional view showing the relationship between the focus ring 12, worktable 11, and wafer W, in the plasma etching apparatus 1. FIG. 3A is a plan view showing the focus ring 12. As shown in FIG. 3A, the focus ring 12 has an inner region 12a, middle region 12b, and outer region 12c disposed in this order from the inner side to surround the wafer W. An inner extending step 12d is formed on the inner side of the inner region 12a and extends under the wafer W. The inner region 12a, middle region 12b, outer region 12c, and inner extending step 12d are arranged concentric. On the side (upper side) to be exposed to plasma, the surfaces of the inner region 12a, outer region 12c, and inner extending step 12d are formed of a dielectric body, while the surface of the middle region 12b is substantially formed of a conductive body (including a case where a thin protection insulating film is formed on the outermost surface). The surface of the middle region 12b is formed of a number of surface portions disposed equidistantly in the angular direction.

The middle region 12b is arranged to shift the peak of plasma density to the outside of the peripheral edge of the wafer W. If there is no middle region 12b, the peak of plasma density appears substantially directly above the peripheral edge of the wafer W (see the curved line PD1 in FIG. 9B). More specifically, the width of the inner region 12a in the radial direction is set to be 0 to 5 mm, and preferably 1 to 3 mm. The width of the middle region 12b in the radial direction is set to be 1 to 10 mm, and preferably 2 to 5 mm. The ratio of the width of the inner region 12a and outer region 12c in the radial direction relative to the width of the middle region 12b in the radial direction is set to be 2 to 29, and preferably 5 to 14.

The focus ring 12 has a ring-like main body 17 formed of a dielectric body, such as quartz, or ceramic, e.g., Al$_2$O$_3$ or SiC. The main body 17 is provided with a number of throughholes 17a formed equidistantly in the angular direction, at positions displaced toward the inside in the radial direction. Adjustment members 18 formed of a conductive body, such as silicon or aluminum surfaced with alumina, are inserted into the throughholes 17a. The inner region 12a, outer region 12c, and inner extending step 12d employ the main body 17, while the middle region 12b employs the adjustment members 18.

Each of the adjustment members 18 has a stem inserted in the corresponding throughhole 17a and a flange 18a connected at its bottom. The sub-mount surface 11b of the worktable 11 to place the focus ring 12 thereon is provided with recesses 11c formed at predetermined intervals in the angular direction, for respectively accepting the flanges 18a. The focus ring 12 is positioned relative to the worktable 11 by means of engagement between the flanges 18a and recesses 11c. The depth of the recesses 11c is set in accordance with the thickness of the flanges 18a. The recesses 11c may be formed of counterbores or the like the same as those used for screws for fixing the worktable 11.

The conductive adjustment members 18 inserted in the throughholes 17a of the main body 17 work as antennas for attracting plasma. Since the adjustment members 18 are exposed on the surface and in contact with plasma, the plasma is attracted onto the adjustment members 18. In other words, the focus ring 12 works on the plasma to focus it toward the wafer W as a whole, but the adjustment members 18 attracts part of the focusing plasma. As a consequence, as shown by a curved line PD2 in FIG. 2, the peak of plasma density is shifted toward the adjustment members 18 and is modified to be higher at the shifted position, as compared to the peak of plasma density appearing substantially directly above the peripheral edge of the wafer W (see the curved line PD1 in FIG. 9B) where there are no adjustment members 18. It follows that the plasma density becomes uniform over the central potion and the peripheral edge of the wafer W, so that abnormal electric discharge is reliably prevented from occurring on the peripheral edge of the wafer W.

Next, an explanation will be given of a processing method performed in the plasma etching apparatus 1 shown in FIG. 1. Specifically, the process chamber 2 is supplied with a process gas while it is exhausted, so that the inside of the process chamber 2 is kept at a predetermined vacuum level. In this state, the worktable (lower electrode) 11 is supplied with an RF power of 2 MHz, and the showerhead (upper electrode) 4 is supplied with an RF power of 60 MHz. As a consequence, plasma of the process gas is generated between the worktable 11 and showerhead 4. The plasma is focused toward the surface of the wafer W by the agency of the focus ring 12, and etches the wafer W.

At this time, as shown by the curved line PD2 in FIG. 2, a high peak of the plasma density appears outside the peripheral edge of the wafer W, due to the middle region 12b of the focus ring 12, which corresponds to the adjustment members 18 and thus is substantially conductive. As a consequence, the plasma density becomes uniform over the central potion and the peripheral edge of the wafer W, so that abnormal electric discharge is reliably prevented from occurring on the peripheral edge of the wafer W.

Figure 4A:
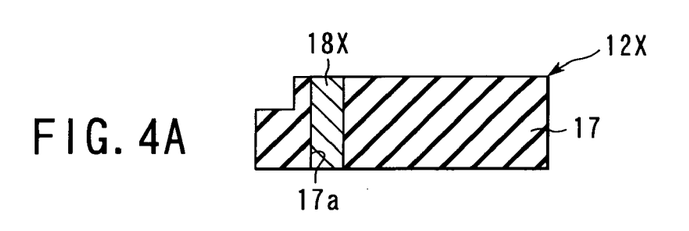
FIGS. 4A, 4B, and 4C are views respectively showing modifications of the focus ring shown in FIG. 2.

FIG. 4A is a view showing a modification 12X of the focus ring 12. The focus ring 12X differs from the focus ring 12 shown in FIG. 2, in that it employs adjustment members 18X respectively formed of stems with no flanges. Specifically, a ring-like main body 17 formed of a dielectric body, such as quartz, is provided with a number of throughholes 17a formed equidistantly in the angular direction. The adjustment members 18X formed of a conductive body are inserted into the throughholes 17a. Since the adjustment members 18X have no flanges 18a, there is no need for the sub-mount surface 11b of the worktable 11 to have the recesses 11c.

Figure 4B:
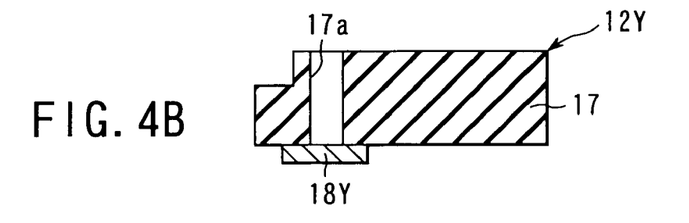

FIG. 4B is a view showing another modification 12Y of the focus ring 12. The focus ring 12Y differs from the focus ring 12 shown in FIG. 2, in that it employs adjustment members 18Y formed of circular plates with no stems. Specifically, a ring-like main body 17 formed of a dielectric body, such as quartz, is provided with a number of throughholes 17a formed equidistantly in the angular direction. The circular plate adjustment members 18Y are disposed along the bottom of the throughholes 17a. The sub-mount surface 11b of the worktable 11 may be provided with a ring-like recess.

Figure 3B:
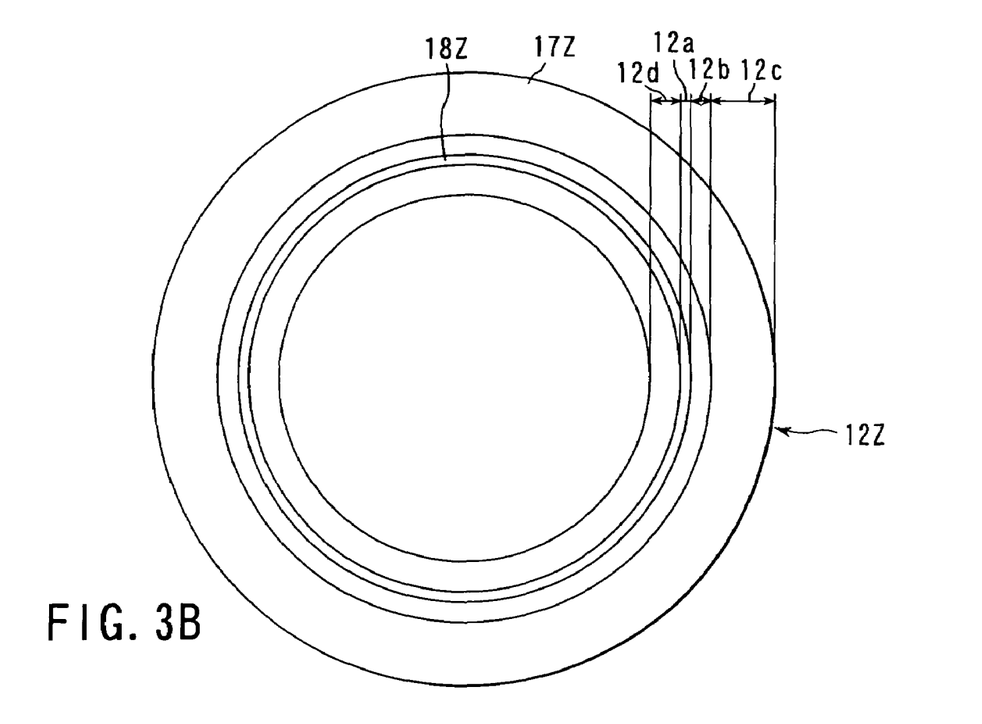
Figure 4C:
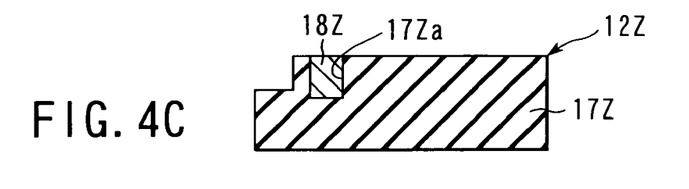

FIG. 4C is a view showing still another modification 12Z of the focus ring 12. FIG. 3B is a plan view showing the focus ring 12Z. The focus ring 12Z differs from the focus ring 12 shown in FIG. 2, in that it employs a ring-like adjustment member 18Z formed of a substantially conductive body. Specifically, a ring-like main body 17Z formed of a dielectric body, such as quartz, is provided with a ring-like groove 17Za formed in the upper surface of the main body 17Z and not penetrating through the main body 17Z in the thickness direction. The ring-like adjustment member 18Z formed of a conductive body is disposed in the groove 17Za. As a consequence, a continuous ring-like surface, which is substantially conductive, is formed in the middle region 12b, as shown in FIG. 3B.

Figure 5:
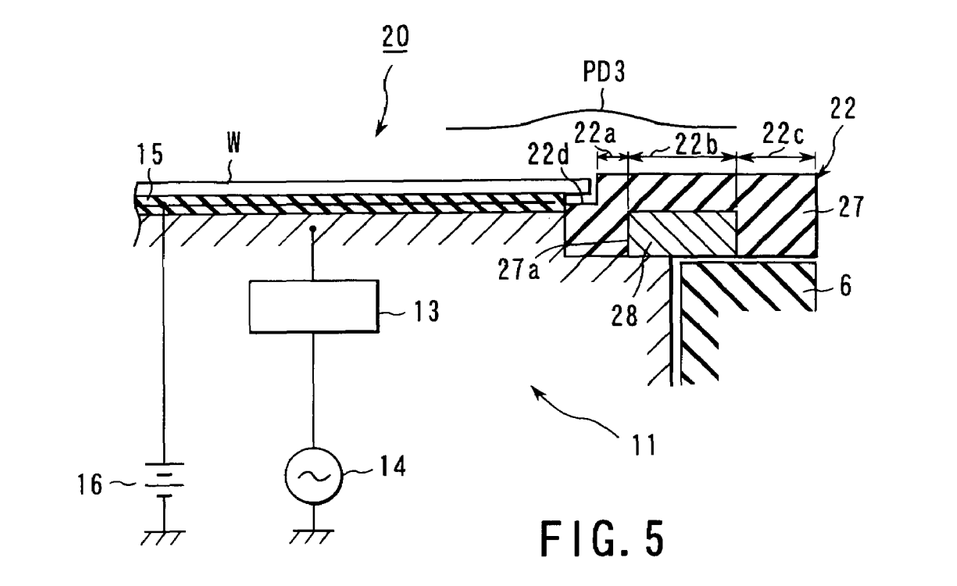
FIG. 5 is an enlarged sectional view showing the relationship between a focus ring, worktable, and wafer, in a plasma etching apparatus according to another embodiment of the present invention.

FIG. 5 is an enlarged sectional view showing the relationship between the focus ring 22, worktable 11, and wafer W, in a plasma etching apparatus 20 according to another embodiment of the present invention. The plasma etching apparatus 20 has a structure the same as the plasma etching apparatus 1 shown in FIG. 1, except some portions relating to a focus ring 22.

Figure 6:
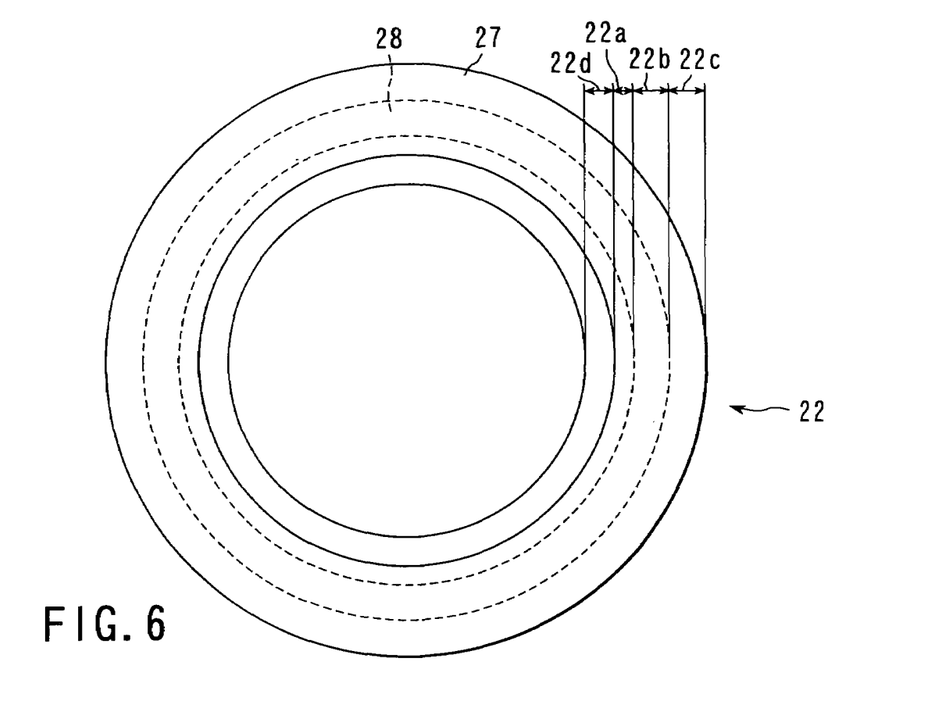
FIG. 6 is a plan view showing the focus ring in FIG. 5.

FIG. 6 is a plan view showing the focus ring 22. As shown in FIG. 6, the focus ring 22 has an inner region 22a, middle region 22b, and outer region 22c disposed in this order from the inner side to surround the wafer W. An inner extending step 22d is formed on the inner side of the inner region 22a and extends under the wafer W. The inner region 22a, middle region 22b, outer region 22c, and inner extending step 22d are arranged concentric. On the side (upper side) to be exposed to plasma, the surfaces of the inner region 22a, outer region 22c, middle region 22b, and inner extending step 22d are formed of a dielectric body. In the following explanation, the inner region 22a and middle region 22b are referred to as a first region, and the outer region 22c is referred to as a second region, when necessary.

The first region 22a and 22b is arranged such that it has a resistance lower than the second region 22c in the thickness direction, and the peak of plasma density appearing substantially directly above the peripheral edge of the wafer W (see the curved line PD1 in FIG. 9B) becomes lower than that in a case where the first region 22a and 22b has a resistance equal to that of the second region 22c in the thickness direction. In other words, the focus ring 22 is designed such that the first region 22a and 22b has an insulating level lower than the second region 22c. More specifically, the width of the inner region 22a in the radial direction is set to be 0 to 5 mm, and preferably 1 to 3 mm. The width of the middle region 22*b* in the radial direction is set to be 5 to 15 mm, and preferably 8 to 12 mm. The ratio of the width of the second region 22*c* in the radial direction relative to the width of the first region 22*a* and 22*b* in the radial direction is set to be 0.5 to 5, and preferably 1 to 2.3.

The focus ring 22 has a ring-like main body 27 formed of a dielectric body, such as quartz, or ceramic, e.g., $Al_2O_3$ or SiC. The main body 27 is provided with a ring-like groove 27*a* formed in the lower surface of the main body 27 and not penetrating through the main body 27 in the thickness direction, at a position displaced toward the inside in the radial direction. An adjustment member 28 formed of a conductive body, such as silicon or aluminum surfaced with alumina, is disposed in the groove 27*a*. The inner region 22*a*, outer region 22*c*, and inner extending step 22*d* are formed only of the main body 27, while the middle region 22*b* is formed of the combination of the main body 27 with the adjustment member 28.

Since the conductive adjustment member 28 is disposed in the groove 27*a* of the main body 27, the first region 22*a* and 22*b* has a resistance lower than the second region 22*c* in the thickness direction. Accordingly, the function of the focus ring 22 to repel plasma (i.e., the function of directing plasma toward the wafer W) is lower at the first region 22*a* and 22*b*. This suppresses the plasma focusing toward the wafer W, so that the plasma is prevented from excessively concentrating on the peripheral edge of the wafer W. As a consequence, the peak of plasma density appearing substantially directly above the peripheral edge of the wafer W (see the curved line PD1 in FIG. 9B) becomes lower, as shown by a curved line PD3 in FIG. 5. It follows that the difference in plasma density between the central potion and the peripheral edge of the wafer W becomes smaller, so that abnormal electric discharge is reliably prevented from occurring on the peripheral edge of the wafer W.

Next, an explanation will be given of a processing method performed in the plasma etching apparatus 20 shown in FIG. 5. The explanation will be given with reference to FIG. 1 as well as FIG. 5, because the members not shown in FIG. 5 are common to FIG. 1. Specifically, the process chamber 2 is supplied with a process gas while it is exhausted, so that the inside of the process chamber 2 is kept at a predetermined vacuum level. In this state, the worktable (lower electrode) 11 is supplied with an RF power of 2 MHz, and the showerhead (upper electrode) 4 is supplied with an RF power of 60 MHz. As a consequence, plasma of the process gas is generated between the worktable 11 and showerhead 4. The plasma is focused toward the surface of the wafer W by the agency of the focus ring 12, and etches the wafer W.

At this time, as shown by the curved line PD3 in FIG. 5, a very low peak of the plasma density appears substantially directly above the peripheral edge of the wafer W, due to the first region 22*a* and 22*b* of the focus ring 12 having a lower insulating level, which corresponds to the adjustment member 28. As a consequence, the difference in plasma density between the central potion and the peripheral edge of the wafer W becomes smaller, so that abnormal electric discharge is reliably prevented from occurring on the peripheral edge of the wafer W.

Figure 7A:
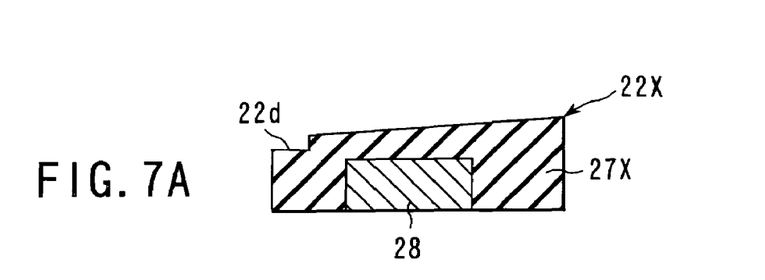
FIGS. 7A, 7B, and 7C are views respectively showing modifications of the focus ring shown in FIG. 5.

FIG. 7A is a view showing a modification 22X of the focus ring 22. The focus ring 22X differs from the focus ring 22 shown in FIG. 5, in that the top surface of a dielectric main body 27X is inclined outwardly upward. With this arrangement, the thickness of the dielectric main body 27X itself is smaller at the position closer to the inner side in the radial direction, and thus a first region 22*a* and 22*b* has a lower insulating level. As a consequence, the peak of the plasma density appearing substantially directly above the peripheral edge of the wafer W is further lower.

Figure 7B:
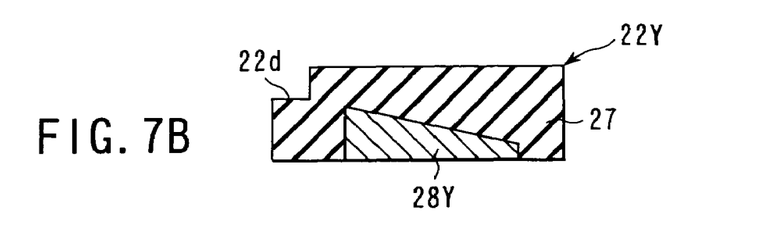

FIG. 7B is a view showing another modification 22Y of the focus ring 22. The focus ring 22Y differs from the focus ring 22 shown in FIG. 5, in that the top surface of a conductive adjustment member 28Y is inclined outwardly downward. With this arrangement, the thickness of the conductive adjustment member 28Y itself is larger at the position closer to the inner side in the radial direction, and thus a first region 22*a* and 22*b* has a lower insulating level. As a consequence, the peak of the plasma density appearing substantially directly above the peripheral edge of the wafer W is further lower.

Figure 7C:
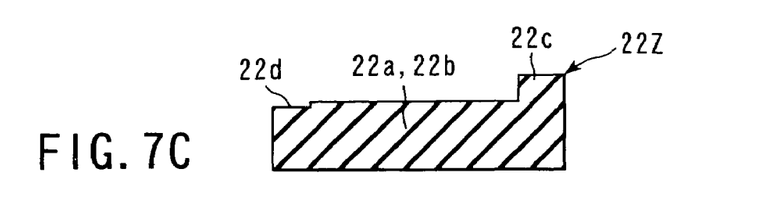

FIG. 7C is a view showing a modification 22Z of the focus ring 22. The focus ring 22Z differs from the focus ring 22 shown in FIG. 5, in that it is formed only of a dielectric main body 27Z without the adjustment member 28. The dielectric main body 27Z has three portions different in thickness, such that the thickness is smaller at the position closer to the inner side in the radial direction. The innermost portion is an inner extending step 22*d*, the middle portion corresponds to a first region 22*a* and 22*b*, and the outer portion corresponds to a second region 22*c*. With this arrangement, the first region 22*a* and 22*b* has a resistance lower than the second region 22*c* in the radial direction, resulting in the same effect as the focus ring 22 shown in FIG. 5.

A focus ring may be formed by combining the dielectric main body 27X having a top surface inclined outwardly upward shown in FIG. 7A, and the conductive adjustment member 28Y having a top surface inclined outwardly downward shown in FIG. 7B. Furthermore, where a focus ring is formed only of a dielectric main body, as shown in FIG. 7C, the main body may have a top surface inclined outwardly upward.

In the embodiments described above, silicon or aluminum surfaced with alumina exemplifies a conductive body for the adjustment member of a focus ring. Alternatively, a conductive body, such as silicon carbide or carbon, compatible with use in a semiconductor process chamber, may be used. In the focus rings shown in FIGS. 2, 4A, and 4B, the performance of the focus rings may be adjusted by changing the intervals between the adjustment members. In the focus rings shown in FIGS. 5, 7A, and 7B, the conductive adjustment member may be divided into parts disposed at intervals in the angular direction.

In the embodiments described above, an etching apparatus of the parallel plate type is shown as an example, but the present invention may be applied to a plasma etching apparatus of the magnetron type, RIE type, or ECR type. Furthermore, the present invention may be applied to a plasma film-forming apparatus, such as a plasma CVD apparatus. Furthermore, the present invention may be applied to a target substrate other than a semiconductor wafer, such as an LCD substrate or glass substrate.

The present invention is not limited to the above embodiments and can be variously modified without departing from the spirit and scope of the invention when practiced. Also, the embodiments can be appropriately combined as much as possible when they are practiced. In this case, combined effects are obtained.

The invention claimed is:

1. A plasma processing apparatus for a semiconductor process, comprising:
   an airtight process chamber;
   a supply system configured to supply a process gas into the process chamber;
   an exhaust system configured to vacuum-exhaust the process chamber;

an exciting mechanism configured to excite the process gas to turn into plasma;

a worktable disposed in the process chamber and having a main mount surface to support a target substrate having a target surface extending in a horizontal direction; and a focus ring disposed to surround the target substrate in order to cause the plasma to focus toward the target surface, wherein the focus ring comprises a ring main body consisting essentially of a material selected from the group consisting of quartz, and ceramic of $Al_2O_3$ or SiC, and an adjustment member fitted in the ring main body and consisting essentially of a material selected from the group consisting of silicon, aluminum surfaced with alumina, silicon carbide, and carbon, the ring main body and the adjustment member are positioned relative to one another and the target surface to set a peak of density of the plasma at a position outside an outer edge of the target substrate so as to provide a more uniform density of the plasma on the target substrate, the ring main body provides an inner region configured to surround the target substrate, and having a surface extending substantially in the horizontal direction to surround the target substrate and consisting essentially of a dielectric on a side to be exposed to the plasma, the adjustment member provides a middle region surrounding the inner region, and having a surface extending substantially in the horizontal direction to surround the target substrate and consisting essentially of an electric conductor that is continuous in a horizontal angular direction on a side to be exposed to the plasma, and the ring main body also provides an outer region surrounding the middle region, and having a surface extending substantially in the horizontal direction to surround the target substrate and consisting essentially of a dielectric on a side to be exposed to the plasma, and wherein the ring main body further includes an inner extending step consisting essentially of a dielectric and being disposed on an inner side of the inner region to extend below and spaced apart from the target substrate.

2. The plasma processing apparatus according to claim 1, wherein the inner region has a width of 0 to 5 mm in a radial direction.

3. The plasma processing apparatus according to claim 2, wherein the middle region has a width of 1 to 10 mm in a radial direction.

4. The plasma processing apparatus focus ring according to claim 1, wherein the surfaces of the inner region, the middle region, and the outer region are flush with each other.

5. The plasma processing apparatus according to claim 1, wherein the supply system is configured to supply as the process gas an etching gas for etching the target surface.

6. A plasma processing apparatus for a semiconductor process, comprising:

an airtight process chamber;

a supply system configured to supply a process gas into the process chamber;

an exhaust system configured to vacuum-exhaust the process chamber;

an exciting mechanism configured to excite the process gas to turn into plasma;

a worktable disposed in the process chamber and having a main mount surface to support a target substrate having a target surface extending in a horizontal direction; and a focus ring disposed to surround the target substrate in order to cause the plasma to focus toward the target surface, wherein the focus ring comprises a ring main body consisting essentially of a material selected from the group consisting of quartz, and ceramic of $Al_2O_2$ or SiC, and an adjustment member fitted in the ring main body and consisting essentially of a material selected from the group consisting of silicon, aluminum surfaced with alumina, silicon carbide, and carbon, the ring main body and the adjustment member are positioned relative to one another and the target surface to suppress an increase in density of the plasma at an outer edge of the target substrate so as to provide a more uniform density of the plasma on the target substrate, the ring main body and the adjustment member are arranged to form a first region configured to surround the target substrate, and a second region surrounding the first region, the first region and the second region respectively having a first surface and a second surface extending substantially in the horizontal direction to surround the target substrate and consisting essentially of a dielectric provided by the ring main body on a side to be exposed to the plasma, and the ring main body has a ring-like groove that is continuous in a horizontal angular direction formed in a lower portion corresponding to the first region, and the adjustment member has a ring shape that is continuous in a horizontal angular direction to surround the target substrate and is fitted in the ring-like groove, such that resistance of the first region below the first surface is lower than that of the second region below the second surface in a thickness direction, wherein the ring main body further includes an inner extending step consisting essentially of a dielectric and being disposed on an inner side of the first region to extend below and spaced apart from the target substrate.

7. The plasma processing apparatus according to claim 6, wherein the ring main body is thinner at an inner periphery than at an outer periphery.

8. The plasma processing apparatus according to claim 6, wherein the adjustment member is thicker at an inner periphery than at an outer periphery.

9. The plasma processing apparatus according to claim 6, wherein the first and second surfaces of the first and second regions are flush with each other.

10. The plasma processing apparatus according to claim 6, wherein the supply system is configured to supply as the process gas an etching gas for etching the target surface.

* * * * *